US011309267B2

(12) United States Patent
Chu et al.

(10) Patent No.: US 11,309,267 B2
(45) Date of Patent: Apr. 19, 2022

(54) SEMICONDUCTOR DEVICE INCLUDING UNEVEN CONTACT IN PASSIVATION LAYER AND METHOD OF MANUFACTURING THE SAME

(71) Applicant: Winbond Electronics Corp., Taichung (TW)

(72) Inventors: Yen-Jui Chu, Taichung (TW); Jin-Neng Wu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/929,109

(22) Filed: Jul. 15, 2020

(65) Prior Publication Data

US 2022/0020711 A1    Jan. 20, 2022

(51) Int. Cl.
*H01L 23/00*    (2006.01)
(52) U.S. Cl.
CPC .............. *H01L 24/05* (2013.01); *H01L 24/03* (2013.01); *H01L 24/45* (2013.01); *H01L 24/85* (2013.01); *H01L 2224/05017* (2013.01)
(58) Field of Classification Search
CPC ......... H01L 24/05; H01L 24/03; H01L 24/45; H01L 24/85; H01L 2224/05017
USPC .......................................... 257/784; 438/617
See application file for complete search history.

(56) References Cited

U.S. PATENT DOCUMENTS

| | | | |
|---|---|---|---|
| 9,978,698 | B1 | 5/2018 | Trulli et al. |
| 2015/0270488 | A1* | 9/2015 | Akiyama ............ H01L 51/0529 257/40 |
| 2015/0287663 | A1 | 10/2015 | Ishihara |
| 2016/0093581 | A1 | 3/2016 | Jeong et al. |
| 2016/0329244 | A1* | 11/2016 | Chiao ............... H01L 23/49827 |
| 2017/0287841 | A1 | 10/2017 | Fang et al. |
| 2019/0311973 | A1* | 10/2019 | Ingerly ................... H01L 25/50 |

FOREIGN PATENT DOCUMENTS

| | | |
|---|---|---|
| CN | 104275803 | 10/2017 |
| TW | 201640976 | 11/2016 |

OTHER PUBLICATIONS

"Office Action of Taiwan Counterpart Application", dated Jul. 31, 2020, p. 1-p. 5.
"Office Action of Taiwan Counterpart Application", dated Jan. 12, 2021, p. 1-p. 6.

* cited by examiner

*Primary Examiner* — Didarul A Mazumder
(74) *Attorney, Agent, or Firm* — JCIPRNET

(57) ABSTRACT

Provided is a semiconductor device including a substrate, a passivation layer, and a connector. The passivation layer is disposed on the substrate. The connector is embedded in the passivation. An interface of the connector in contact with the passivation layer is uneven, thereby improving the structural stability of the connector. A method of manufacturing the semiconductor is also provided.

9 Claims, 4 Drawing Sheets

SEMICONDUCTOR DEVICE INCLUDING UNEVEN CONTACT IN PASSIVATION LAYER AND METHOD OF MANUFACTURING THE SAME

BACKGROUND OF THE INVENTION

Field of the Invention

The present invention relates to a semiconductor device and a method of manufacturing the same.

Description of Related Art

Recently, the continuous increase in the integration of various electronic components (e.g., transistors, diodes, resistors, capacitors, and so on) leads to the rapid growth of the semiconductor industry. The increase in the integration mostly results from the continuous reduction of the minimum feature size, so that more components can be integrated into a given area.

In the conventional technology, the bonding pads under the conductive wires are often pulled out of the substrate due to the pulling force of the wire bonding process, thereby reducing the yield. Therefore, how to prevent the bonding pads from being pulled out of the substrate and improve the yield will become an important issue in the future.

SUMMARY OF THE INVENTION

The invention provides a semiconductor device and a method of manufacturing the same in which the connector is embedded in the passivation layer and the interface of the connector in contact with the passivation layer is uneven, thereby improve the structural stability of the connector.

The invention provides a semiconductor device including a substrate, a passivation layer, and a connector. The passivation layer is disposed on the substrate. The connector is embedded in the passivation. An interface of the connector in contact with the passivation layer is uneven.

The invention provides a method of manufacturing a semiconductor device including: providing a substrate; forming a passivation layer on the substrate by a first 3D printing technology, wherein the passivation layer has an opening with an uneven sidewall; and forming a connector in the opening by a second 3D printing technology.

Based on the above, in the embodiment of the present invention, the connector is embedded in the passivation layer and the interface of the connector in contact with the passivation layer is uneven, thereby improving the structural stability of the connector. In the case, the adhesion between the connector and the substrate is enhanced, which is able to prevent the connector from being pulled out of the substrate after the bonding process, thereby improving the yield.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
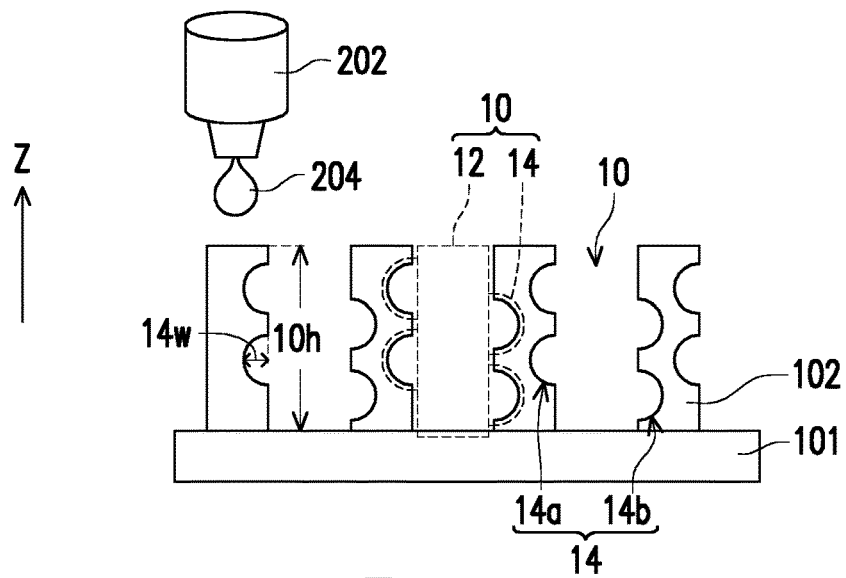
FIG. 1A to FIG. 1C are schematic cross-sectional views illustrating a manufacturing process of a semiconductor device according to an embodiment of the disclosure.

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Figure 1B:
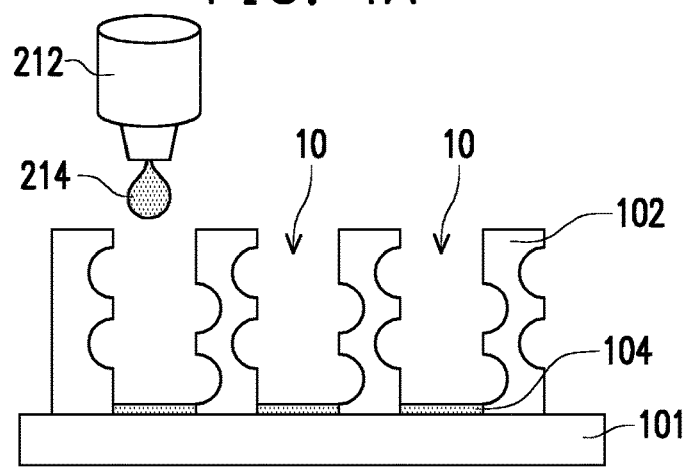
Figure 1C:
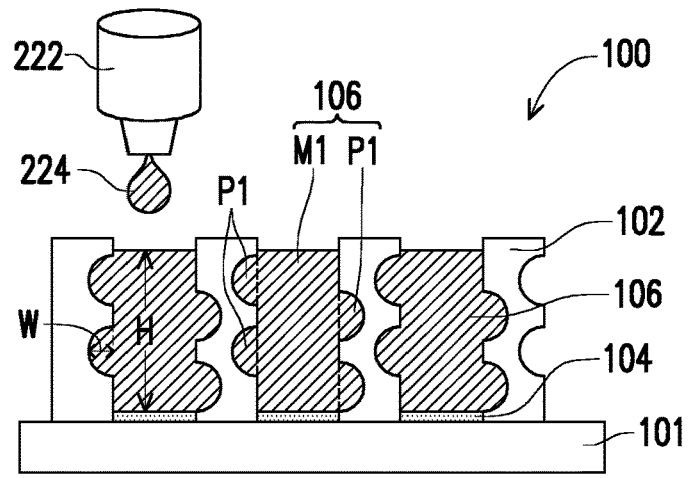
Figure 2A:
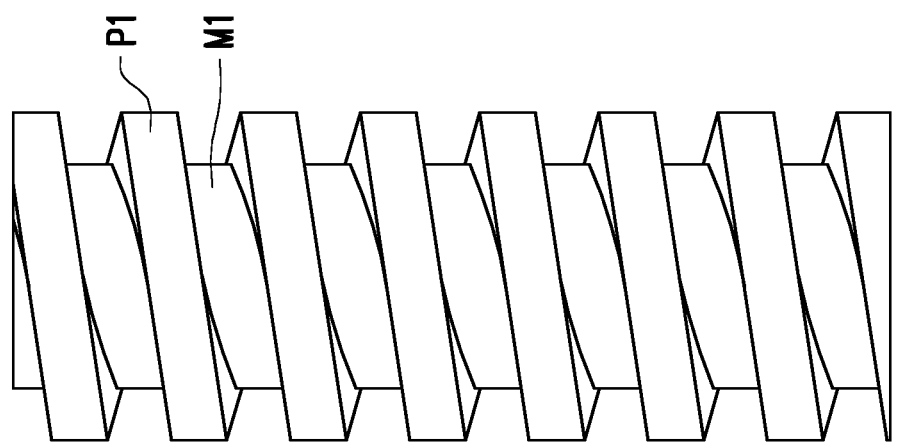
FIG. 2A to FIG. 2C are perspective views of the connector illustrated in FIG. 1C according to various embodiments, respectively.
Figure 2B:
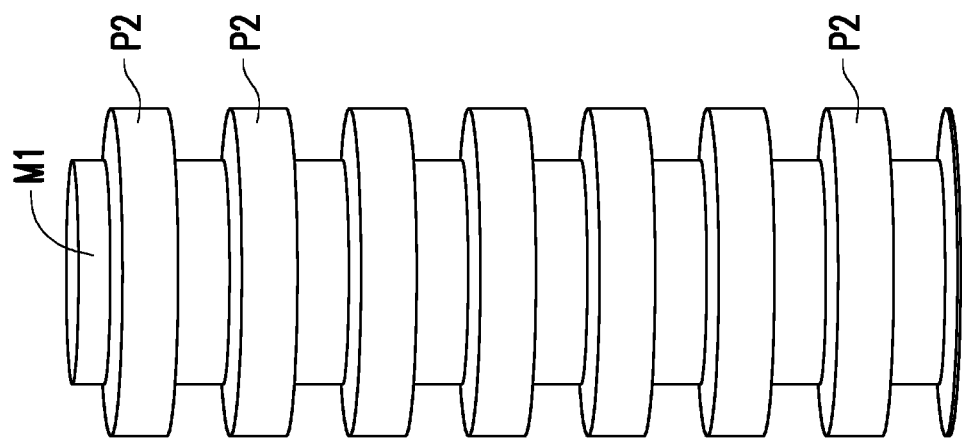
Figure 2C:
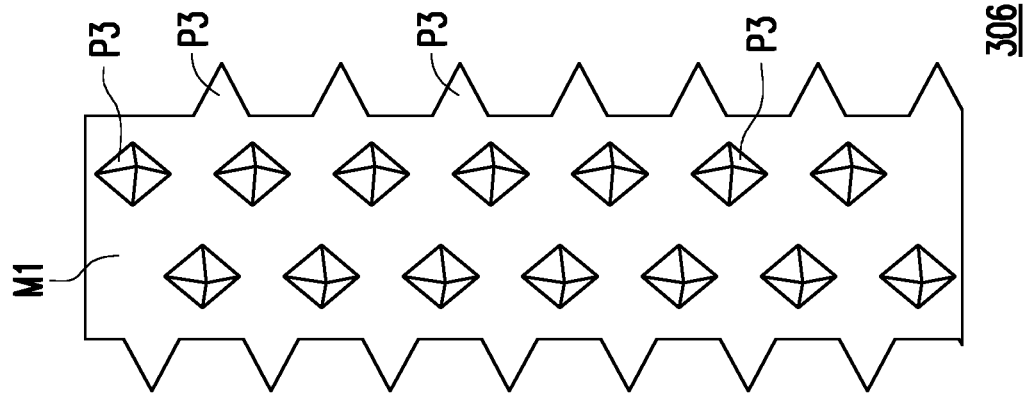

FIG. 1A to FIG. 1C are schematic cross-sectional views illustrating a manufacturing process of a semiconductor device according to an embodiment of the disclosure. FIG. 2A to FIG. 2C are perspective views of the connector illustrated in FIG. 1C according to various embodiments, respectively.

Referring to FIG. 1, the present embodiment provides a method of manufacturing a semiconductor device includes following steps. First, a substrate 101 is provided. In the present embodiment, the substrate 101 may be a silicon substrate. In FIG. 1A, no device is disposed in the substrate 101; however, the substrate 101 provided in the present embodiment may be equipped with active devices (e.g., a transistor, a diode, and so on), passive devices (e.g., a capacitor, an inductor, a resistor, and so on), or a combination thereof. In other embodiments, the substrate 101 may be equipped with logic devices, memory devices, or a combination thereof.

Next, a passivation layer 102 is formed on the substrate 101 by a first 3D printing technology. In an embodiment, the first 3D printing technology includes an ink jet printing process, an aerosol jet printing process, or a combination thereof. The aerosol jet printing process is taken as an example, wherein an aerosol jet deposition head is applied to form an annularly propagating jet constituted by an outer sheath flow and an inner aerosol-laden carrier flow. During the annular aerosol jet printing process, an aerosol stream of the to-be-deposited materials is concentrated and deposited onto a surface to be formed. Said step may be referred to as maskless mesoscale material deposition (M3D), i.e., the deposition step can be performed without using any mask.

In the present embodiment, as shown in FIG. 1A, the first 3D printing technology includes ejecting an insulation ink 204 onto the substrate 101 through a nozzle 202 of a 3D printing device. After that, a curing step is performed to cure the insulation ink 204 into a passivation layer 102. In some embodiments, the curing step includes a photo-curing step or a thermal curing step. For example, the photo-curing step may be irradiating light with a wavelength of about 395 nm to 405 nm to cure the insulation ink 204 into the passivation layer 102. In one embodiment, the simulation ink 204 includes a photo-curable material, a hydrophobic material, a polymer material, or a combination thereof. For example, the insulation ink 204 may be polydimethylsiloxane (PDMS), polyimide, or the like.

After the curing step, as shown in FIG. 1A, the passivation layer 102 has openings 10. The openings 10 have uneven sidewalls. Specifically, in an embodiment, one of the openings 10 have a body portion 12 and a protrusion portion 14. The protrusion portion 14 protrudes from the body portion 12 into the passivation layer 102. In the cross-sectional direction, the protrusion portion 14 has a curved surface protruding from the body portion 12 to the passivation layer 102. The protrusion portions 14a, 14b on both sides of each body portion 12 are staggered with each other in the Z direction to form a spiral shape surrounding the body portion 12. In some embodiments, a ratio of a height 10h of the opening 10 to a width 14w of the protrusion portion 14 is 10:4 to 10:1. That is to say, in the present embodiment, the sidewalls of the openings 10 are intentionally formed to be uneven, thereby improving the structural stability of the connectors 106 (shown in FIG. 1C) subsequently formed. In alternative embodiments, since the passivation layer 102 is formed by the first 3D printing technology, the passivation layer 102 is integrally formed and continuously formed along the Z direction. To some extent, the height of the passivation layer 102 may be increased and the shape of the sidewall of the passivation layer 102 may be changed according to actual needs.

Referring to FIG. 1B, an adhesive layer 104 is formed on the bottom surfaces of the openings 10 through another 3D printing technology. The said 3D printing technology includes ejecting a self-assembled monolayer (SAM) ink 214 into the openings 10 through a nozzle 212 of a 3D printing device. In an embodiment, the adhesive layer 104 may be, for example, a self-assembled monolayer. A material of the self-assembled monolayer may include an organosilane-based material, such as chlorosilane molecules. It should be noted that the adhesive layer 104 may be used as a buffer layer to increase the adhesion between the subsequently formed connectors 106 (as shown in FIG. 1C) and the substrate 101 and prevent the stress of the subsequent bonding process from damaging the substrate 101 or the devices in the substrate 101. In alternative embodiments, the step of forming the adhesive layer 104 may also be omitted.

Referring to FIG. 1C. the connectors 106 are formed in the openings 10 through a second 3D printing technology, thereby accomplishing a chip 100. Specifically, a conductive ink 224 is ejected onto the adhesive layer 104 through a nozzle 222 of the 3D printing device, and a curing step is performed to form the connectors 106. In the case, as shown in FIG. 1C, the connectors 106 are embedded in the passivation layer 102 and formed along the openings 10, so that an interface of the connectors 106 in contact with the passivation layer 102 is uneven. In one embodiment, the conductive ink 224 includes a plurality of conductive particles. The conductive particles include a plurality of metal nanoparticles, such as silver nanoparticles, copper-silver nanoparticles, copper nanoparticles, or a combination thereof. In some embodiments, the connectors 106 are formed by the conductive particles which are tightly connected, so as to achieve the effect of uniform electrical conductivity. Unlike the electroplating process, the conductive particles in the connectors 106 of the embodiment directly contact the passivation layer 102. That is, there is no seed layer or barrier layer between the connectors 106 and the passivation layer 102. In addition, although a top surface of the connectors 106 shown in FIG. 1C is lower than a top surface of the passivation layer 102, the present invention is not limited thereto. In other embodiments, the top surface of the connectors 106 may be flush with the top surface of the passivation layer 102.

It should be noted that, as shown in FIG. 1C, one of the connectors 106 includes a body portion M1 and a protrusion portion P1. The body portion M1 has a sidewall perpendicular to the substrate 101. The protrusion portion P1 protrudes outward from the side wall of the body portion M1. In some embodiments, a ratio of a height H of the body portion M1 to a width W of the protrusion portion P1 is 10:4 to 10:1. In other words, in the present embodiment, the interface of the connector 106 in contact with the passivation layer 102 is intentionally formed to be uneven, thereby improving the structural stability of the connector 106. Specifically, the protrusion portion P1 surrounds the sidewall of the body portion M1 to form a spiral structure, as shown in FIG. 2A. However, the present invention is not limited to this. In another embodiment, the protruding portion P2 may include a plurality of annular structures to surround the sidewall of the body portion M1 respectively, thereby forming another connector 206, as shown in FIG. 2B. In other embodiments, the protruding portion P3 includes a plurality of protrusion structures to be individually distributed on the sidewall of the body portion M1, thereby forming the other connector 306, as shown in FIG. 2C. The plurality of protrusion structures may be tapered (see FIG. 2C) or arc-shaped (not shown) in the cross-sectional direction. The protrusion portions P1, P2, and P3 shown in the above FIG. 2A to FIG. 2C may form uneven surfaces in the cross-sectional direction to improve the structural stability of the connectors 106, 206, and 306, and further improve the yield of the connectors 106, 206, and 306 in subsequent bonding processes.

Figure 3:
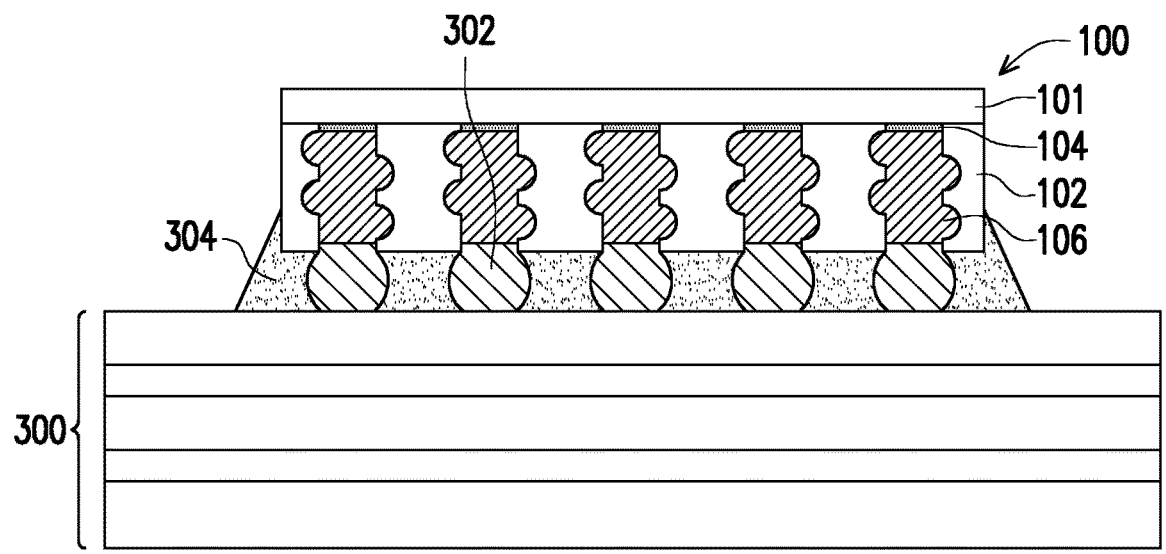
FIG. 3 is a schematic cross-sectional view of a semiconductor device according to a first embodiment of the disclosure.

FIG. 3 is a schematic cross-sectional view of a semiconductor device according to a first embodiment of the disclosure.

In the present embodiment, a semiconductor device of FIG. 3 may be a package structure. Referring to FIG. 3, the chip 100 (or the substrate 101) of FIG. 1C may be electrically connected to a circuit substrate 300 through a flip-chip bonding. The said flip-chip bonding means that the chip 100 is connected to the circuit substrate 300 through a plurality of bumps 302 between the circuit substrate 300 and the chip 100. In addition, an underfill 304 is used to fill in a space between the circuit substrate 300 and the chip 100 to encapsulate the bumps 302. In the case, the connectors 106 and the bumps 302 being in contact with each other may be electrically connected to the circuit substrate 300 and the chip 100 (or the substrate 101). That is, the connectors 106 in the present embodiment may be used as bonding pads in the flip-chip bonding process to withstand the pressure of the flip-chip bonding process. Further, although only one chip 100 is illustrated in FIG. 3, the present invention is not limited thereto. In other embodiments, the number and type of the chip 100 may be adjusted as needs.

Figure 4:
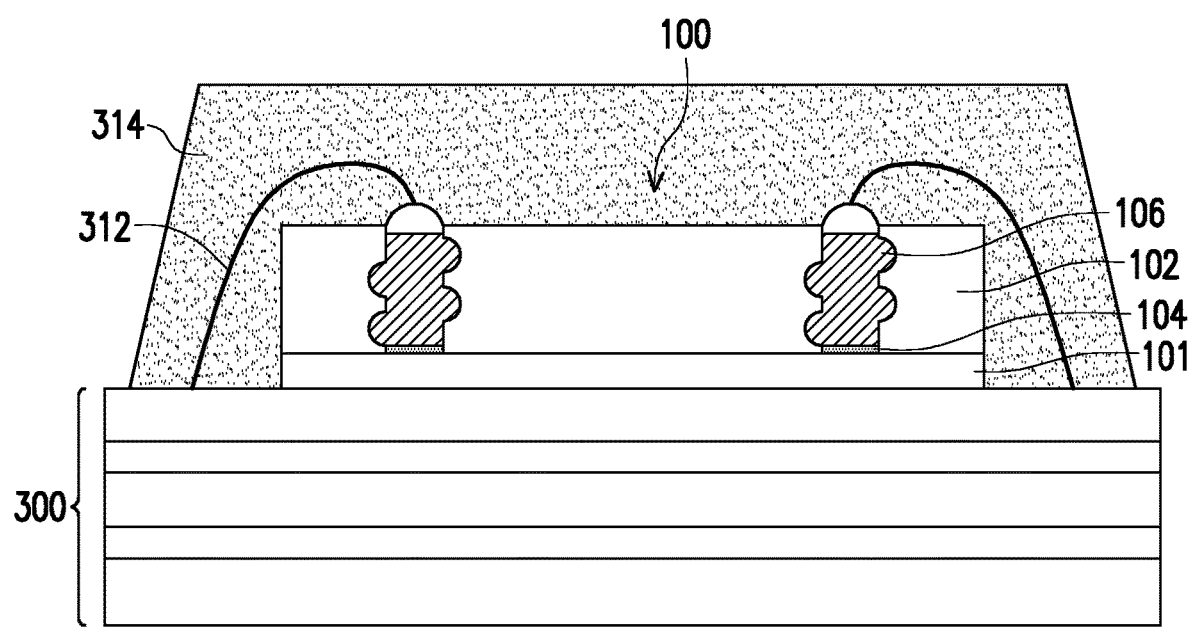
FIG. 4 is a schematic cross-sectional view of a semiconductor device according to a second embodiment of the disclosure.

FIG. 4 is a schematic cross-sectional view of a semiconductor device according to a second embodiment of the disclosure.

In the present embodiment, a semiconductor device of FIG. 4 may be a package structure. Referring to FIG. 4, the chip 100 (or the substrate 101) of FIG. 1C may be electrically connected to the circuit substrate 300 by a wire bonding. The said wire bonding means connecting the circuit substrate 300 and the chip 100 through a plurality of conductive wires 312. In addition, an encapsulant 314 may be formed to cover a portion of the upper surface of the circuit substrate 300 and the chip 100 and encapsulate the conductive wires 312. In the case, the connectors 106 and conductive wires 312 in contact with each other may be electrically connect to the circuit substrate 300 and the chip 100 (or the substrate 101). It should be noted that since the interface of the connectors 106 in contact with the passivation layer 102 is uneven, the structural stability of the connectors 106 may be improved to avoid the connectors 106 being pulled out of the substrate 101 due to the pulling force of the wire bonding process, thereby improving the yield. That is, the connectors 106 in the present embodiment may be used as wire bonding pads in the wire bonding process to withstand the pulling force in the wire bonding process.

The said connectors 106 are not only used as the bonding pads in the said bonding process, in alternative embodiments, the connectors 106 may also be used as conductive vias in a circuit structure. Please refer to the following paragraphs for details.

Figure 5:
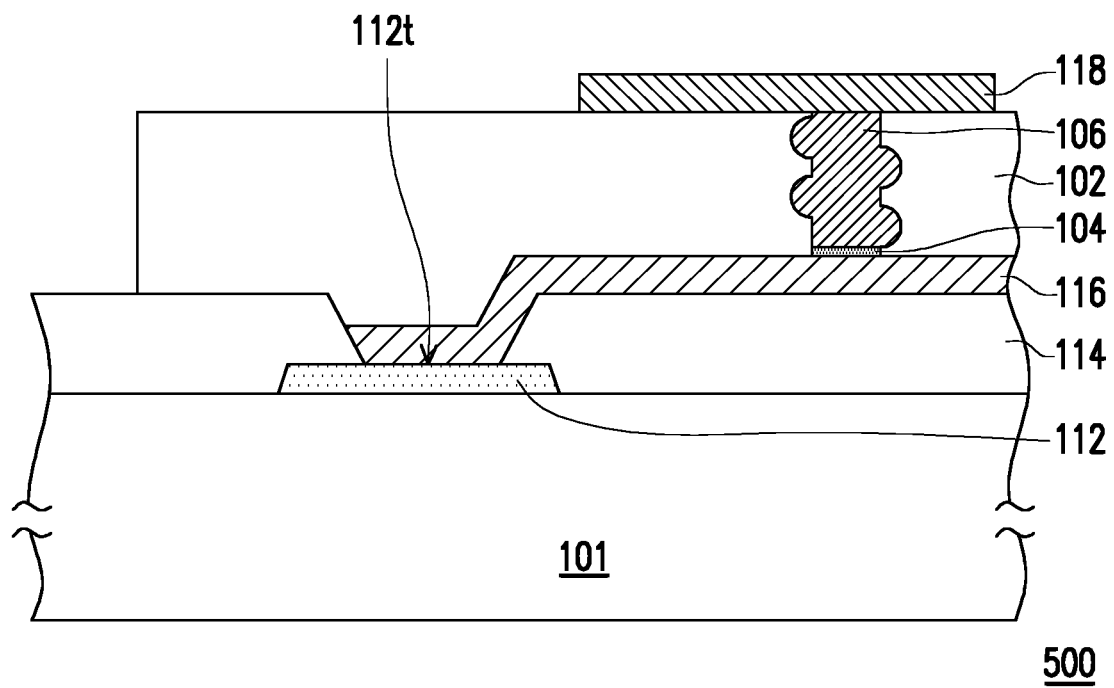
FIG. 5 is a schematic cross-sectional view of a semiconductor device according to a third embodiment of the disclosure.

FIG. 5 is a schematic cross-sectional view of a semiconductor device according to a third embodiment of the disclosure. Herein, the circuit layer shown in the embodiment may be a redistribution layer (RDL), but the present invention is not limited thereto. In other embodiments, the circuit layer may also be an interconnect in a back-end-of-line (BEOL) process, a circuit structure in a circuit board, or the like.

Referring to FIG. 5, a semiconductor device 500 of the third embodiment includes a substrate 101, a pad 112, a dielectric layer 114, a first circuit layer 116, a passivation layer 102, an adhesive layer 104, a connector 106, and a second circuit layer 118.

In detail, the pad 112 is disposed on the substrate 101. In an embodiment, a material of the pad 112 includes a metal material, such as copper, aluminum, gold, silver, nickel, palladium, or a combination thereof. The dielectric layer 114 covers a sidewall and a portion of a top surface of the pad 112, and exposes another portion of the top surface 112t of the pad 112. In an embodiment, a material of the dielectric layer 114 includes a dielectric material, such as silicon oxide, silicon nitride, silicon oxynitride, polyimide, or a combination thereof. In another embodiment, the dielectric layer 114 may be a single-layered structure, a two-layered structure, or a multi-layered structure. The first circuit layer 116 covers the portion of the top surface 112t of the pad 112, and extends from the pad 112 to cover a portion of the top surface of the dielectric layer 114. In an embodiment, the first circuit layer 116 includes a plurality of conductive particles in contact with each other, and may be formed by a 3D printing technology. The conductive particles include a plurality of metal nano particles, such as silver nanoparticles, copper-silver nanoparticles, copper nanoparticles, or a combination thereof.

As shown in FIG. 5, the passivation layer 102 is disposed on the first circuit layer 116 and covers a portion of the top surface of the dielectric layer 114 and a portion of the top surface of the first circuit layer 116. The connector 106 is embedded in the passivation layer 102 and have an uneven sidewall. The adhesive layer 104 may be optionally disposed between the connector 106 and the first circuit layer 116 to increase the adhesion between the connector 106 and the first circuit layer 116. In addition, the first circuit layer 116 is disposed between the connector 106 and the substrate 101, and the connector 106 is offset from the pad 112. In the case, the electrical signal generated by the devices under the pad 112 may be transmitted to the connector 106 through the pad 112 and the first circuit layer 116. The materials and formation methods of the passivation layer 102, the adhesive layer 104, and the connector 106 have been described in detail in the above paragraphs, and will not be repeated here.

As shown in FIG. 5, the second circuit layer 118 is disposed on the passivation layer 102 and the connector 106. In one embodiment, the second circuit layer 118 includes a plurality of conductive particles in contact with each other, and may be formed by a 3D printing technology. The conductive particles include a plurality of metal nanoparticles, such as silver nanoparticles, copper-silver nanoparticles, copper nanoparticles, or a combination thereof. In the case, the connector 106 may be used as a conductive via to electrically connect the first circuit layer 116 and the second circuit layer 118. In some embodiments, since the connector 106 and the second circuit layer 118 are both formed by the 3D printing technology, the connector 106 and the second circuit layer 118 are electrically connected by a plurality of conductive particles in contact with each other. In other words, the connector 106 and the second circuit layer 118 are in direct contact, and there is no obvious interface between the connector 106 and the second circuit layer 118. Further, in the present embodiment, the interface of the connector 106 in contact with the passivation layer 102 is uneven, which can improve the structural stability of the connector 106 and increase the mechanical strength of the semiconductor device 500.

In summary, in the present invention, the connector is embedded in the passivation layer and the interface of the connector in contact with the passivation layer is uneven, thereby improving the structural stability of the connector and the yield of the connector in the subsequent bonding process. In addition, the adhesive layer may be optionally disposed between the connector and the substrate to improve the adhesion there-between, thereby preventing the stress of the bonding process from damaging the devices in the substrate and preventing the connector from being pulled out of the substrate. Further, in the present invention, the connector may be formed by the 3D printing technology, so that the connector is integrally formed, thereby increasing the mechanical strength of the connector.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a semiconductor device, comprising:
   providing a substrate;
   forming a passivation layer on the substrate by a first 3D printing technology, wherein the first 3D printing technology comprises:
      ejecting an insulation ink onto the substrate; and
      performing a curing step to cure the insulation ink into the passivation layer, wherein after the curing step, the passivation layer forms an opening with an uneven sidewall; and
   after forming the passivation layer by the first 3D printing technology, forming a connector in the opening by a second 3D printing technology.

2. The method of manufacturing the semiconductor device according to claim 1, wherein the opening has a body portion and a protrusion portion, the protrusion portion protrudes from the body portion to the passivation layer.

3. The method of manufacturing the semiconductor device according to claim 2, wherein a ratio of a height of the body portion and a width of the protrusion portion is 10:4 to 10:1.

4. The method of manufacturing the semiconductor device according to claim 1, wherein the forming the connector by the second 3D printing technology comprises using a conductive ink, the conductive ink comprises a plurality of metal nanoparticles, and the plurality of metal nanoparticles comprise silver nanoparticles, copper-silver nanoparticles, copper nanoparticles, or a combination thereof.

5. The method of manufacturing the semiconductor device according to claim 4, wherein the plurality of metal nanoparticles is in direct contact with the passivation layer.

6. The method of manufacturing the semiconductor device according to claim 1, wherein a material of the passivation layer comprises a hydrophobic material.

7. The method of manufacturing the semiconductor device according to claim 1, further comprising connecting the substrate to a circuit substrate by a wire bonding or a flip-chip bonding, wherein the connector is electrically connected to the substrate and the circuit substrate.

8. The method of manufacturing the semiconductor device according to claim 1, further comprising:
   forming a first circuit layer between the substrate and the connector; and
   forming a second circuit layer on the connector, wherein the connector is electrically connected to the first and second circuit layers.

9. The method of manufacturing the semiconductor device according to claim 1, further comprising forming an adhesive layer between the connector and the substrate by an additional 3D printing technology, wherein the adhesive layer comprises a self-assembled monolayer.

* * * * *